United States Patent [19]

Moyer

[11] 4,399,610
[45] Aug. 23, 1983

[54] ASSEMBLING AN ELECTRONIC DEVICE

[75] Inventor: Harold W. Moyer, Allentown, Pa.

[73] Assignee: Western Electric Company, Inc., New York, N.Y.

[21] Appl. No.: 249,752

[22] Filed: Apr. 1, 1981

[51] Int. Cl.³ .......................... H01R 43/00; B23P 23/00
[52] U.S. Cl. ..................................... 29/827; 29/566.2; 29/566.3; 174/52 FP; 357/70
[58] Field of Search ................. 29/591, 827, 740, 741, 29/827; 174/52 FP, 52 R; 357/70

[56] References Cited

U.S. PATENT DOCUMENTS

| | | |
|---|---|---|
| 3,141,492 | 7/1964 | Petree et al. |
| 3,193,166 | 7/1965 | Bickel et al. |
| 3,396,758 | 8/1968 | Hall |
| 3,519,033 | 7/1970 | Pepin |
| 3,591,911 | 7/1971 | Goldschmied |
| 3,611,061 | 10/1971 | Segerson ........................ 29/589 X |
| 3,738,398 | 6/1973 | Galloway |
| 3,796,201 | 3/1974 | Golub |
| 3,837,374 | 9/1974 | Plante |
| 3,838,984 | 10/1974 | Crane et al. ................. 174/52 FP X |
| 3,899,305 | 8/1975 | Hilgers et al. ..................... 357/70 X |
| 4,038,744 | 8/1977 | Cheype et al. .......................... 29/827 |
| 4,205,433 | 6/1980 | Araki et al. |
| 4,215,360 | 7/1980 | Eytcheson ......................... 29/589 X |
| 4,234,666 | 11/1980 | Gursky ............................ 357/70 X |
| 4,259,436 | 3/1981 | Tabuchi et al. .............. 174/52 R X |
| 4,330,683 | 5/1982 | Parker ............................ 174/52 FP |
| 4,331,831 | 5/1982 | Ingram et al. |

Primary Examiner—Gene Crosby
Assistant Examiner—Carl J. Arbes
Attorney, Agent, or Firm—D. C. Watson; W. O. Schellin

[57] ABSTRACT

An electronic device (10) is attached to a carrier tape (20) by a cluster (22) of leads (12) which are closely spaced relative to each other. The device (10) is detached from tape (20) along with the leads (12) and tape members (28) interconnecting such leads (12) for maintaining the spacings therebetween. The leads (12) are formed with a given configuration while the members (28) are still attached. Such members (28) are then trimmed from the leads (12) to electrically isolate such leads (12) while still maintaining the desired spacings therebetween.

10 Claims, 6 Drawing Figures

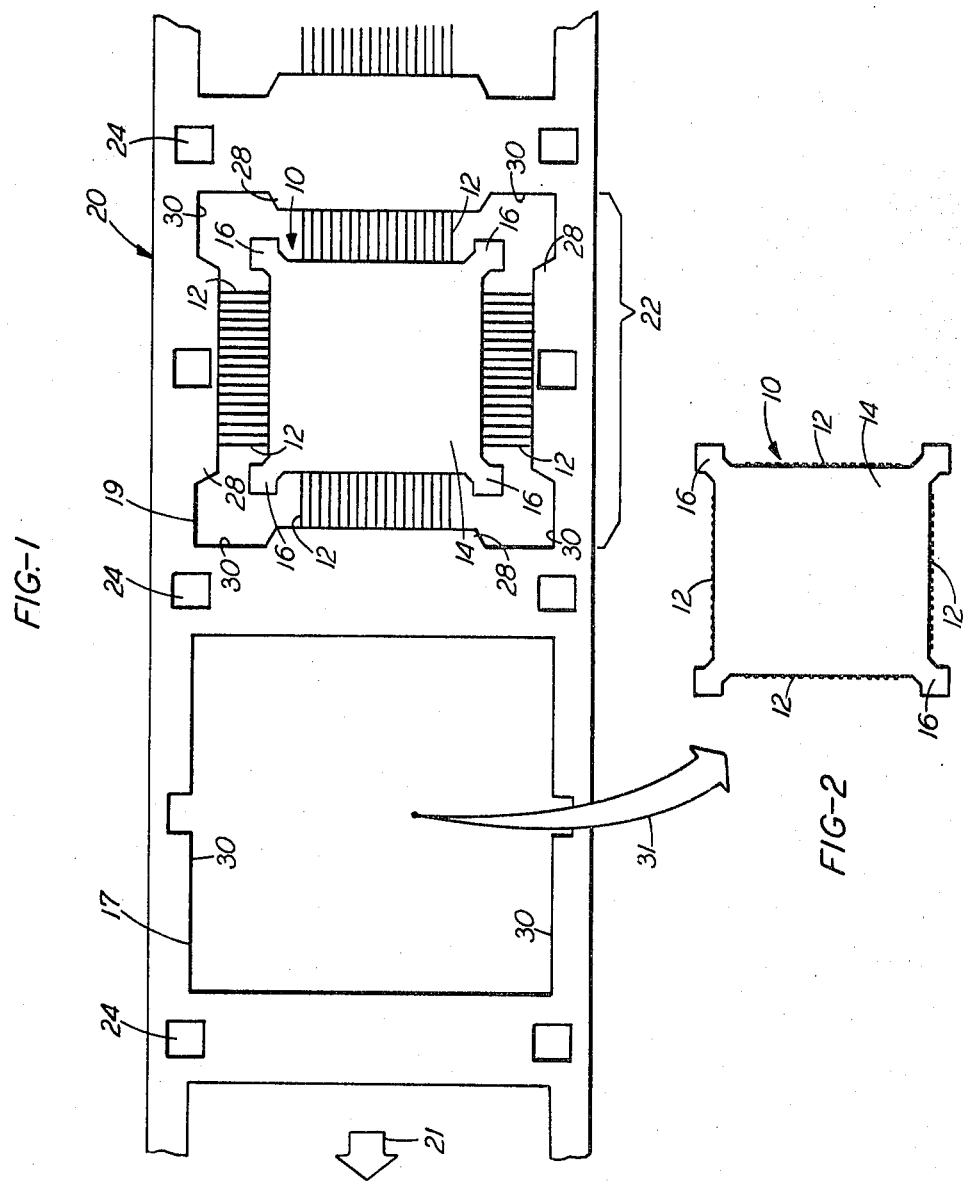

FIG.-3
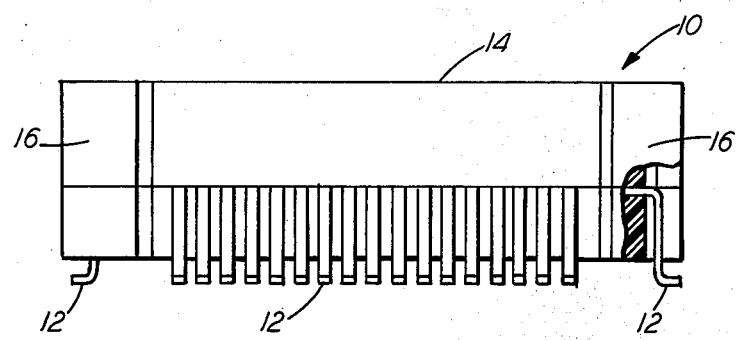
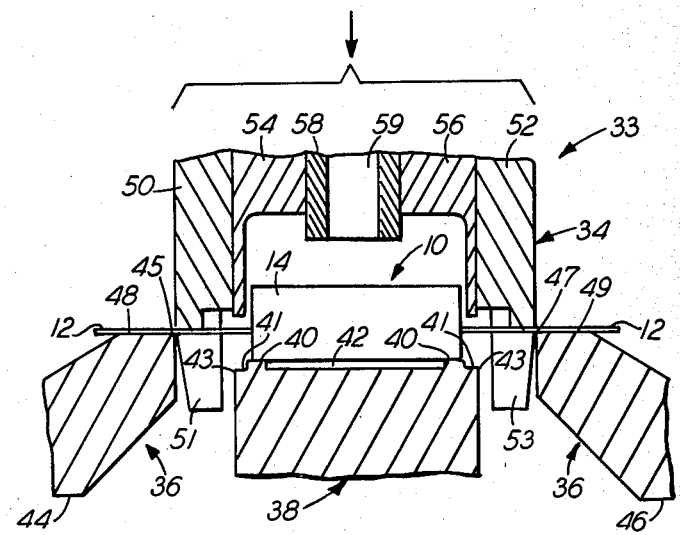
FIG.-4

ASSEMBLING AN ELECTRONIC DEVICE

TECHNICAL FIELD

This invention relates to assembling an electronic device attached to a sheet via a plurality of leads. More particularly during the assembly of the device, this invention relates to forming each of a plurality of leads into a given configuration while maintaining desired spacings therebetween.

BACKGROUND OF THE INVENTION

In the assembly of electronic devices, integrated circuit chips are enclosed alone or with other devices in a package having a plurality of leads extending therefrom. The industry seems trending toward an increasing number of such leads while the packages are being kept as small as possible to conserve space in service. Consequently, leads are becoming more densely arranged and adapting them for service connection has become a significant problem.

One method of providing densely arranged leads for assembling such an electronic device is to employ a carrier tape preferably made of conductive material. The leads are conventionally formed therein in clusters by photolithography and etching. The tape is indexed for bonding a chip and/or other device to the lead clusters and often a second bonding takes place to stiff leads in another lead frame, such stiff leads being insertable into a P-C board.

The packaging of an assembled device in protective material also typically takes place while an assembled device is still in a lead frame. Thereafter, each device is separately detached from the lead frame environment and leads are usually bent, shaped or otherwise adapted for service connection.

In one popular, lineally leaded package, the leads are aligned in two rows causing the device to be referred to as a dual inline package (DIP). With an increasing number of leads now being used, a problem with a DIP package is that it tends to become so long that service space is used inefficiently.

In another scheme, the leads are arranged in four rows extending from four sides of a typically square package sometimes referred to as a "Mini-Quad." Now the number of leads in a Mini-Quad range up to about 60 or 70 and heavier tape material is used without a second bonding to make leads which are adapted for surface mounting on a substrate. It will be appreciated that detaching such a package from a tape and adapting such a dense arrangement of leads for service while maintaining isolative spacings therebetween is a difficult task.

SUMMARY OF THE INVENTION

In view of the foregoing, it is an object of this invention to provide new and improved methods and apparatus for assembling an electronic device. Another object is to assemble an electronic device attached to a sheet via a plurality of leads. A further object during the assembly of such device, is to form each of a plurality of leads into a given configuration while maintaining desired spacings therebetween.

With these and other objects in mind, the present invention includes detaching from the sheet the device with the leads attached thereto and to at least one sheet member interconnecting the leads for maintaining desired spacings therebetween. The leads are formed into a given configuration while the interconnecting member is still attached. Such member is then trimmed from the leads to electrically isolate the leads from each other while maintaining the desired spacings therebetween.

In a preferred embodiment, the sheet is a carrier tape having clusters of finger-like leads formed therein. Each lead has a first end affixed to the tape and a second end extending toward the center of the cluster and being affixed to the electronic device.

In a further embodiment, there are at least two opposing rows of leads along at least two opposing edges of a device. The forming provides L-configurations in the leads such that when the device is placed upon a planar surface, all leads make substantially simultaneous contact with such surface.

BRIEF DESCRIPTION OF THE DRAWING

The above-described and other objects, advantages and features of the invention will be more easily understood from the following detailed description when read in conjunction with the accompanying drawing, wherein:

FIG. 1 is a plan view of a carrier tape suitable for practicing the instant invention.

FIG. 2 is a plan view of an electronic device assembled in a mini-quad package in accordance with the instant invention.

FIG. 3 is an elevational view, with a portion partially cut away, of the packaged device shown in FIG. 2.

FIG. 4 is a cross sectional view of a punch and die set in a first stage for detaching a device from a tape according to the instant invention.

Figure 5:
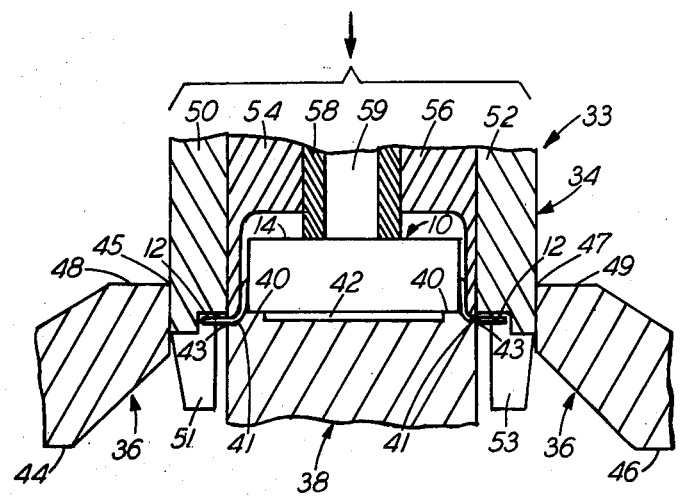
FIG. 5 illustrates a second stage in operation of the set shown in FIG. 4.

It can be seen that some elements in the figures are abbreviated or simplified to highlight certain features of the invention. Also, where appropriate, reference numerals have been repeated in the figures to designate the same or corresponding features in the drawing.

DETAILED DESCRIPTION

The Packaged Device

In each of FIGS. 1-6, there appears at least one packaged device designated generally by the numeral 10 which is assembled in accordance with the instant invention. Device 10 typically includes a chip (not shown) embodying an integrated circuit. Alternately, device 10 may include an electronic circuit on a ceramic substrate or other component requiring the protection of a package and electrical connection to the outside world.

In the illustrative example, device 10 includes a plurality of leads 12 extending from a body 14 which includes a molded plastic material encapsulating a circuit component (not shown) and the inner ends of the leads 12. As best seen in FIG. 3, the leads 12 are formed in an L-configuration such that all leads make substantially simultaneous contact with a planar surface. Note also that body 14 is supported above such surface a predetermined distance, e.g., about 0.015 inches, to permit a cleaning solution to flow between the body 14 and a service substrate. At each corner of the body 14 a bumper 16 protrudes away from body 14 a sufficient distance to protect the leads 12 from damage in handling. A typical packaged device 10 is more fully described in U.S. Pat. No. 4,331,831 issued May 25, 1982 to A. J.

Ingram et al, based on patent application Ser. No. 210,776, filed Nov. 28, 1980, assigned to Bell Telephone Laboratories, Incorporated.

Carrier Tape

FIG. 1 illustrates at least two frames 17 and 19 of a carrier tape 20 which is suitable for assembling devices in the practice of the instant invention. Tape 20 is about 19 m.m. wide to accommodate idler and sprocket wheels analogous to those typically used to drive motion picture films. Accordingly, such wheels are used to guide and drive tape 20 in the direction of arrow 21 for assembling devices 10 therewith.

Tape 20 is preferably made from conductive sheet material such as copper which is from about 1 to about 4 mils in thickness and may be designated CDA-102 OFHC by the Copper Development Association. Where only the tape material provides the leads 12 for service connection, the metal may be hardened to obtain spring temper.

Leading frame 17 illustrates a condition in tape 20 when a device 10 is detached therefrom and trailing frame 19 illustrates a condition when a device 10 is ready to be detached. Note in frame 19, that the leads 12 are typically provided in clusters 22 which may, for example, be spaced about 0.75 inches along the length of tape 20. Each cluster 22 typically includes sprocket perforations 24 for indexing the tape 20 in a lengthwise direction. A cluster 22 also includes finger-like leads 12, each having a first end affixed to the tape 20 and a second end (not shown) extending toward the center where said second end is affixed to a circuit within the device 10. In the example shown, the leads 12 are disposed in rows along the edges of device 10 and each row has a sheet member 28 extending to an inside frame edge 30 to interconnect the leads 12 when they are detached from the tape 20.

It will be appreciated that the interconnecting members 28 perform an important function in the practice of the invention. In the illustrative example the leads 12 are about 8 mils wide with a space of about 8 mils between each lead. Without some expedient to maintain such spacings, the leads 12 tend to become disorganized as device 10 is detached from tape 20 and the leads 12 are formed and trimmed.

Tape 20 is indexed in cycles and each frame is stopped at various stations for chip bonding, packaging and similar functions. FIG. 1 illustrates a frame 17 which remains after a device 10 is detached according to an arrow 31.

Method of Assembly

In a method of practicing the invention there are essentially three steps performed seriatim upon device 10 and its cluster 22 of leads 12 between FIG. 1 and FIGS. 2 or 3. In each step a separate function is performed and each such function is preferably performed substantially simultaneously upon all leads 12 in a cluster 12. For example, in the first step all leads 12 in a cluster 22 are severed along frame edge 30 such that the device 10, the four rows of leads 12 and four interconnecting members 28 are detached from frame 17. While members 28 remain advantageously attached to the rows of leads 12 in the second step, the leads are formed into the L-configuration best seen in FIG. 3. The four interconnecting members 28 are then severed from the leads 12 to finish the assembly of device 10.

Apparatus For Assembly

Figure 6:
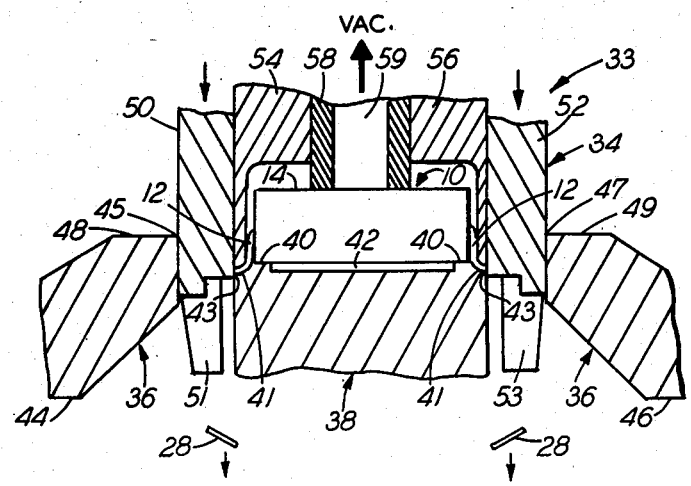
FIG. 6 illustrates a third stage in operation of the set shown in FIG. 4.

FIGS. 4–6 illustrate an apparatus designated generally by the numeral 33 which is presently preferred in practicing the method described above. Apparatus 33 includes the following items with the following general designations: a composite punch 34, a die 36 and a pedestal 38. Pedestal 38 includes a raised, four-sided frame 40 for supporting four edges of the body 14 of a device 10 and for providing four die surfaces in a frame 41 for forming L-configurations in the leads 12. Pedestal 38 also includes a four-sided framed cutting edge 43 to make a final cut upon the cluster 22 of leads 12. Pedestal 38 further includes a cavity 42 for collecting any dirt shed from a body 14 or a device 10.

Die 36 includes four members of which only member 44 and 46 are shown. Members 44 and 46 include edges 45 and 47, respectively, for making a first cut upon leads 12 in rows along left and right edges of the device 10 as shown in FIGS. 4–6. Members 44 and 46 also include flat surfaces 48 and 49, respectively, for supporting the leads 12. It will be appreciated that the unseen members of die 36 have similar edges and similar surfaces for cutting and supporting rows of leads 12 on front and back edges of the device 10.

The composite punch 34 includes four outside cutting members of which only 50 and 52 are shown in FIGS. 4–6. Punch 34 also includes four inside forming members of which only 54 and 56 are shown in FIGS. 4–6. Punch 34 further includes a central member 58 containing a bored duct 59 through which a vacuum can be drawn. It can be seen that members 50 and 54 act upon a row of leads 12 along the left edge of device 10 while members 52 and 56 work upon leads 12 along the right edge of said device. It will also be appreciated that two similar cutting members and two similar forming members work upon leads 12 along the front and back edges of the device 10, all according to FIGS. 4–6.

Each cutting member including 50 and 52 also has tapered pilot probes extending from the ends thereof to center the device 10 upon pedestal 38. Probes 51 and 53 shown in FIGS. 4–6 extend from an unseen cutting member which works upon leads 12 along the back edge of device 10. By reference to FIG. 1, it can be seen that there are tapered shoulders on each end of an interconnecting member 28 which shoulders are engaged by the pilot probes in centering device 10 on pedestal 38.

The operation of apparatus 33 proceeds essentially in three steps corresponding to the method steps previously described. A frame of tape 20, such as frame 19, is indexed into apparatus 33 whereupon punch 34 is lowered and pilot probes including 51 and 53 center a device 10 on pedestal 38. It can be seen in FIG. 4 that the left and right rows of leads 12 become disposed, respectively, upon surfaces 48 and 49 of die members 44 and 46, respectively. In a further lowering of punch 34, the four cutting members including 50 and 52 engage the leads 12 upon four respective die cutting edges including 45 and 57. Device 10, including the interconnecting members 28, are detached from tape 20, but members 28 remain attached to the leads 12.

In a further lowering of punch 34 as seen in FIG. 5 the four forming members including 54 and 56 engage the leads 12 along the four sides of body 14. Such leads 12, with the interconnecting members 28 attached thereto, are driven into the four die forming surfaces in frame 41 on pedestal 38. Note up to this point, that all parts of punch 34 have moved together and that central member 58 with vacuum duct 59 has now contacted the body 14 of device 10.

In the last step, as shown in FIG. 6, only the four cutting members including 50 and 52 continue lowering and the formed leads 12 are engaged by inside edges of the cutting members including 50 and 52 upon the cutting edges of frame 43 on pedestal 38. In this manner, the interconnecting members 28 are then detached from the leads 12 and each member 28 falls away as shown.

It is incidentally noted in FIG. 6 that a vacuum is drawn through conduit 59 of member 58 such that when punch 34 is subsequently raised a completed device 10 is lifted from pedestal 38. A track (not shown) is then inserted within apparatus 33, device 10 is released upon the track and the track is withdrawn.

Alternate Embodiments

It will be apparent to one of ordinary skill in the art that it is not necessary to employ a monolithic web such as tape 20 in practicing the invention. For example, a composite web of material including a plastic substrate with clusters of conductive leads formed thereon could as well be used to assemble a device 10. Further, it is evident that a broad sheet of material such as copper could be used with parallel rows of lead clusters 22 formed therein for such assembly.

Although the invention is described with respect to a packaged device 10 haveing four rows of leads 12 extending therefrom, it is within the spirit of the invention to use interconnecting members 28 on practically any number of rows of leads 12. Moreover, device 10 need not be packaged but could, for example, be a chip or a miniceramic substrate carrying circuitry.

It is also apparent that other punch and die sets could be used to perform the three functions performed by apparatus 33. For example, after the forming step in FIG. 5, the pedestal 38 could be lowered against other cutting edges (not shown) to detach the interconnecting members 28. In such a case, cutting and forming members such as 50 and 54 could be combined into one member.

There have been disclosed herein certain embodiments of the invention and applications thereof. Nevertheless, it is to be understood that various and sundry modifications and refinements may be made and used which differ from that disclosed without departing from the spirit and scope of the instant invention.

What is claimed is:

1. A method of assembling an electronic device attached to a sheet via a plurality of leads, comprising:
   detaching from the sheet the device including the leads attached to the device and at least one sheet member interconnecting such leads for maintaining desired spacings therebetween during lead forming;
   forming the leads into a given configuration whereby said at least one interconnecting member detached from said sheet continues to maintain the desired spacing between the leads; and then
   trimming the at least one interconnecting member from the leads to electrically isolate said leads from each other without substantially disturbing the desired spacings therebetween.

2. A method as in claim 1, wherein the sheet is a carrier tape having clusters of finger-like leads formed therein, each lead having a first end affixed to the tape and a second end extending toward and affixed to the electronic device in the center of the cluster, said leads also being disposed along the edges of the device in at least one row having a sheet member interconnecting the leads in said row when it is detached from the tape, the detaching step further comprising:
   detaching at each cluster the device with the leads and one or more interconnecting members in a substantially simultaneous manner.

3. A method as in claim 2, wherein the forming is done upon each lead of a device in a substantially simultaneous manner.

4. A method as in claims 2 or 3, wherein the one or more interconnecting members are trimmed from leads of a device in a substantially simultaneous manner.

5. A method as in claims 2, 3 or 4, wherein there are at least two opposing rows of leads along at least two opposing edges of a device and wherein the forming step further comprises:
   forming L-configurations in the leads such that when the device is placed upon a planar surface, all leads make substantially simultaneous contact with such surface and the device is uniformly supported along the at least two edges.

6. Apparatus for assembling an electronic device attached to a sheet via a plurality of leads, comprising:
   means for detaching from the sheet the device including the leads attached to the device and at least one sheet member interconnecting such leads for maintaining desired spacings therebetween during lead forming;
   means for forming the leads into a given configuration, said at least one interconnecting member maintaining desired spacings between such leads during the operation of the forming means; and
   means operable after the operation of the forming means for trimming the at least one interconnecting member from the leads to electrically isolate said leads from each other without disturbing the desired spacings therebetween.

7. Apparatus as in claim 6, wherein the sheet is a carrier tape having clusters of finger-like leads formed therein, each lead having a first end affixed to the tape and a second end extending toward and affixed to the electronic device in the center of the cluster, said leads also being disposed along the edges of the device in at least one row having a sheet member interconnecting the leads in said row when it is detached from the tape, the detaching means further comprising:
   means for detaching at each cluster the device with the leads and one or more interconnecting members in a substantially simultaneous manner.

8. Apparatus as in claim 7, wherein the means for forming are arranged to form each lead of a device in a substantially simultaneous manner.

9. Apparatus as in claims 7 or 8, wherein the means for trimming are arranged to trim the said one or more interconnecting members from leads of a device in a substantially simultaneous manner.

10. Apparatus as in claims 7, 8 or 9, wherein there are at least two opposing rows of leads along at least two opposing edges of a device and wherein the forming means further comprises:
   means for forming L-configurations in the leads such that when the device is placed upon a planar surface, all leads make substantially simultaneous contact with such surface and the device is uniformly supported along the at least two edges.

* * * * *

REEXAMINATION CERTIFICATE (1831st)
United States Patent
Moyer

[11] B1 4,399,610
[45] Certificate Issued  Nov. 3, 1992

[54] ASSEMBLING AN ELECTRONIC DEVICE

[75] Inventor: Harold W. Moyer, Allentown, Pa.

[73] Assignee: AT&T Technologies, Inc., Arlington, Va.

Reexamination Request:
No. 90/002,367, Jun. 17, 1991

Reexamination Certificate for:
Patent No.: 4,399,610
Issued: Aug. 23, 1983
Appl. No.: 249,752
Filed: Apr. 1, 1981

[51] Int. Cl.⁵ .................. H01R 93/00; B23P 23/00
[52] U.S. Cl. ........................ 29/827; 29/566.2; 29/566.3; 174/52.4; 357/70
[58] Field of Search ............. 174/52.4; 29/827, 566.2, 29/566.3, 591, 740, 741, 52.2; 357/70

[56] References Cited
U.S. PATENT DOCUMENTS

| | | |
|---|---|---|
| 3,141,492 | 7/1964 | Petrer et al. . |
| 3,193,166 | 7/1965 | Bickel et al. . |
| 3,396,758 | 8/1968 | Hall . |
| 3,519,033 | 7/1970 | Pepin . |
| 3,591,911 | 7/1971 | Goldschmied . |
| 3,611,061 | 10/1971 | Segerson .................. 29/589 X |
| 3,738,398 | 6/1973 | Galloway . |
| 3,796,201 | 3/1974 | Golub . |
| 3,837,374 | 9/1974 | Plante . |
| 3,838,984 | 10/1974 | Crane et al. .............. 174/52 FP X |
| 3,899,305 | 8/1975 | Hilgers et al. ............... 357/70 X |
| 4,038,744 | 8/1977 | Cheype ........................ 29/827 |
| 4,044,201 | 8/1977 | Wallick . |
| 4,205,433 | 6/1980 | Araki et al. . |
| 4,215,360 | 7/1980 | Eytcheson ................... 29/589 X |
| 4,234,666 | 11/1980 | Gursky ...................... 357/70 X |
| 4,259,436 | 3/1981 | Tabuchi et al. ........... 174/52 R X |
| 4,330,683 | 5/1982 | Parker ....................... 174/52 FP |
| 4,331,831 | 5/1982 | Ingram et al. . |

OTHER PUBLICATIONS

Integrated Circuit Engineering Basic Technology 5th Ed. Copyright Oct, 1966 pp. 10-4 to 10-7 by Integrated Circuit Engineering Corp.
*Integrated Circuit Engineering Corporation*, p. 10-6, 1966.

*Primary Examiner*—Carl J. Arbes

[57] ABSTRACT

An electronic device (10) is attached to a carrier tape (20) by a cluster (22) of leads (12) which are closely spaced relative to each other. The device (10) is detached from tape (20) along with the leads (12) and tape members (28) interconnecting such leads (12) for maintaining the spacings therebetween. The leads (12) are formed with a given configuration while the members (28) are still attached. Such members (28) are then trimmed from the leads (12) to electrically isolate such leads (12) while still maintaining the desired spacings therebetween.

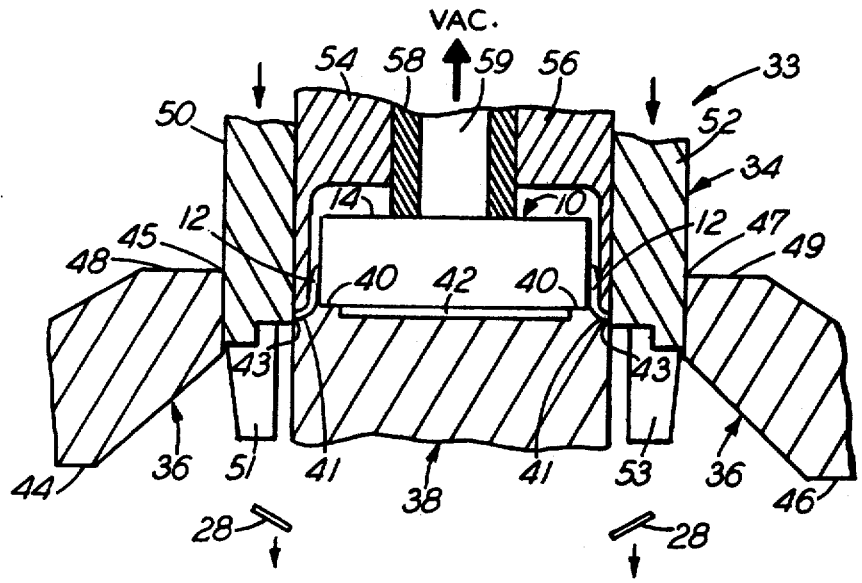

REEXAMINATION CERTIFICATE ISSUED UNDER 35 U.S.C. 307

NO ADMENDMENTS HAVE BEEN MADE TO THE PATENT

AS A RESULT OF REEXAMINATION, IT HAS BEEN DETERMINED THAT:

The patentability of claims 1-10 is confirmed.

* * * * *